United States Patent
Burgess et al.

(10) Patent No.: US 7,282,158 B2
(45) Date of Patent: Oct. 16, 2007

(54) METHOD OF PROCESSING A WORKPIECE

(75) Inventors: Stephen Robert Burgess, Gwent (GB); Andrew Price, Cardiff (GB)

(73) Assignee: Aviza Technology Limited, Newport, Gwent (GB)

( * ) Notice: Subject to any disclaimer, the term of this patent is extended or adjusted under 35 U.S.C. 154(b) by 0 days.

(21) Appl. No.: 11/088,261

(22) Filed: Mar. 24, 2005

(65) Prior Publication Data
US 2005/0211666 A1 Sep. 29, 2005

Related U.S. Application Data

(60) Provisional application No. 60/556,472, filed on Mar. 26, 2004.

(51) Int. Cl.
*C23F 1/00* (2006.01)
(52) U.S. Cl. .................................................. 216/37
(58) Field of Classification Search ..................... None
See application file for complete search history.

(56) References Cited

U.S. PATENT DOCUMENTS

| | | | | | |
|---|---|---|---|---|---|
| 4,980,204 | A | * | 12/1990 | Fujii et al. ..................... 117/98 |
| 5,015,503 | A | * | 5/1991 | Varrin et al. .................. 117/99 |
| 5,139,825 | A | | 8/1992 | Gordon et al. |
| 5,547,539 | A | * | 8/1996 | Arasawa et al. ............ 438/715 |
| 5,554,226 | A | * | 9/1996 | Okase et al. ................ 118/724 |
| 5,637,153 | A | * | 6/1997 | Niino et al. .............. 134/22.11 |
| 5,763,007 | A | * | 6/1998 | Weiller ...................... 427/248.1 |
| 5,772,771 | A | | 6/1998 | Li et al. |
| 5,865,205 | A | * | 2/1999 | Wilmer .......................... 137/2 |
| 5,901,271 | A | * | 5/1999 | Benzing et al. .............. 392/387 |
| 6,162,323 | A | * | 12/2000 | Koshimizu ............. 156/345.26 |
| 6,221,791 | B1 | * | 4/2001 | Wang et al. ................. 438/773 |
| 6,251,187 | B1 | | 6/2001 | Li et al. |
| 6,383,300 | B1 | * | 5/2002 | Saito et al. .................. 118/715 |
| 6,471,781 | B1 | * | 10/2002 | Tobe et al. .................. 118/726 |
| 6,692,575 | B1 | * | 2/2004 | Omstead et al. ............ 118/728 |
| 6,807,971 | B2 | * | 10/2004 | Saito et al. ............... 134/22.11 |
| 6,884,295 | B2 | * | 4/2005 | Ishii et al. ................... 118/715 |
| 6,955,198 | B2 | * | 10/2005 | Wodjenski ................... 141/248 |
| 2002/0002948 | A1 | * | 1/2002 | Hongo et al. ............ 118/723 R |
| 2002/0015791 | A1 | * | 2/2002 | Tobe et al. ............ 427/255.394 |
| 2002/0069930 | A1 | * | 6/2002 | Gregg et al. .................... 141/4 |
| 2002/0076492 | A1 | * | 6/2002 | Loan et al. ............. 427/255.28 |
| 2005/0252448 | A1 | * | 11/2005 | Tai et al. .................... 118/715 |

* cited by examiner

*Primary Examiner*—Allan Olsen
(74) *Attorney, Agent, or Firm*—Volentine & Whitt, PLLC

(57) ABSTRACT

This invention relates to a method of processing a workpiece in a chamber. Initially a surface of the workpiece is treated by a process which includes supplying a reactive gas to the chamber through a first gas supply and the surface is then further treated using a process gas supplied to the chamber through a second gas supply during the supply of the process gas so that a portion of the process gas flows into the first gas supply from the chamber to mitigate against residual reactive gas entering the chamber during the further treatment step.

12 Claims, 3 Drawing Sheets

METHOD OF PROCESSING A WORKPIECE

CROSS REFERENCE TO RELATED APLICATIONS

A claim to priority is made to U.S. Provisional Application 60/556,472 filed Mar. 26, 2004.

BACKGROUND OF INVENTION

1. Field of Invention

This invention relates to a method of processing a workpiece in a chamber.

2. Background of Invention

There are nowadays many manufacturing techniques in which workpieces are treated using a first gas or gas combination, in which at least one of the gases is reactive, and then the workpiece is subjected to a second process. In many cases, both for chemical and processing reasons and for workpiece throughput reasons, it is desirable to perform the second process in the same chamber as the first, often without the chamber being exposed to atmosphere. In such circumstances a reactive gas can become absorbed on or linger in those parts of the gas delivery system and can become active during the second process, particularly if it is an energetic process, such as a plasma process.

In those circumstances if, for example, the first process is a deposition process, then additional deposition may take place during the second process resulting in over thick films and loss of uniformity. One example of such a multi-step process is the deposition of thin layers, e.g. TiN using a metal organic chemical vapour deposition (MOCVD) vapour such as Tetrakis (Diethylamido) Titanium (TDEAT) and $NH_3$ as precursors. Such a process is described in detail in U.S. Pat. No. 5,139,825, which incorporated herein by reference.

The main application of such TiN films is to coat high aspect ratio feature devices, such as trenches and contact structures on wafers containing microelectronic devices. For example TiN is used as a liner between Ti and $WF_6$ during W plug formation. The TiN liner prevents an adverse reaction that occurs between Ti and $WF_6$, thus allowing formation of a pure W plug in the contact.

In order to prevent any intermixing of the reactants prior to entering the chamber, and hence preventing the unwanted deposition within the gas supply lines, it is typical to have the reactive gases entering from different inlets, such as via a dual port showerhead.

It is important that there is a continuous coating of TiN and preferably this coating should be as conformal as possible. The coatings are typically less than 15 nm in thickness with some manufactures using as little as 5 nm. This thickness is likely to reduce even further as microchip critical dimensions decrease. Such thin coatings require very little process gas.

It has been found that TiN deposited using these or similar precursors are prone to absorbing oxygen and moisture on exposure to atmospheres and that a subsequent in situ $H_2/N_2$ plasma treatment of the film reduces oxygen uptake, increases density and makes the fill resistivity more stable and improves the line of properties of the TiN. The plasma treatment has to be performed without a wafer breaking vacuum and this is an example of a case where it is advantageous to be able to deposit a plasma treat in the same process chamber.

In unpublished work the Applicants have determined experimentally that TiN deposition can occur during the subsequent in situ $H_2/N_2$ plasma step thus increasing the film thickness. This is reported more fully below.

Current teaching would suggest that in order to overcome the problem that the Applicants have identified, one should pump or gas purge the TDEAT line after deposition, for example using the kind of arrangement described in U.S. Pat. No. 5,772,771. However, the Applicants have determined, in unpublished work, that TDEAT confirmly decompose in an uncontrolled manner on the wafer surface during purging and that purging takes in excess of several minutes which will impact wafer throughput.

SUMMARY OF INVENTION

From one aspect the invention consists in a method of processing a workpiece in a chamber including the steps of:

(a) treating a surface of the workpiece, the step including supplying a reactive gas to the chamber through a first gas supply; and (b) further treating the treated surface using a process gas supplied to the chamber through a second gas supply characterised in that a negative pressure gradient is created between the chamber and the first gas supply during at least a first part of step (b) so that a portion of the process gas flows into the first gas supply from the chamber to mitigate against residual reactive gas entering the chamber during step (b).

Step (a) may be chemical vapour deposition of any type or etching.

Thus for example, step (a) may be the forming of a film using a metal organic chemical vapour deposition vapour and, for example, $NH_3$ wherein the vapour is supplied to the first gas supply and the $NH_3$ through the second gas supply.

Alternatively, other gases may be used e.g. $N_2H_2$ (hydrozine) or $N_2$ in place of ammonia.

In one preferred embodiment the metal organic vapour is TDEAT although other metal organic vapours may be used e.g. TDMAT, TEMAT.

Step (b) may be one or more of a thermal, plasma, photonic, chemical or mechanical process. Gas-based mechanical processes are typically pressure based.

The negative pressure may be created by reverse pumping of that part of the first gas supply which is in or adjacent the chamber. It is preferred the reverse pumping takes place downstream for a reactive gas shut off valve in the first gas supply.

Although the invention has been described above it is to be understood that it includes any inventive combination of the features set out above or in the following description.

BRIEF DESCRIPTION OF THE DRAWINGS

The invention may be performed in various ways and a specific embodiment will now be described in relation to the accompanying drawings in which:

FIG. 1 is a graph showing the increase in film thickness against time of a plasma process, which occurs if the basic process described above and below is run. It will be seen that there is a significant deposition that takes place during the plasma processing, which illustrates the problem discussed above. To test the hypothesis that this extra deposition is taking place as a result of residual TDEAT absorbed into the gas supply, the Applicants ran the first step of the basic process, first with nitrogen only coming through the first gas supply and then with nitrogen and TDEAT in a helium carrier. Although the graphs are not directly comparable because of the different scales, it can be seen that the recovery in chamber pressure down to its desired pumped out pressure is much slower in the second instance and this would appear to confirm that TDEAT vapour is desorbing slowing from the surfaces mentioned.

FIG. 2 illustrates the apparatus being used by the Applicants and it comprises a chamber 10, which can be evacuated at 11 by a pump (not shown) and contains a workpiece support 12 and a duplex showerhead 13. The showerhead 13 is supplied for a first gas line 14 and a second gas line 15. The first gas line 14 is connected to a TDEAT vaporiser 16 via a shut off valve 17, whereas line 15 can selectively be connected to a source of $NH_3$ or sources of $N_2$ and $H_2$ depending on which part of the process is being performed. A bypass line 19 is connected to the first gas line 14, downstream of the valve 17 and itself can be isolated by a valve 19. The bypass line 18 is connected to a pump 20.

Figure 1:
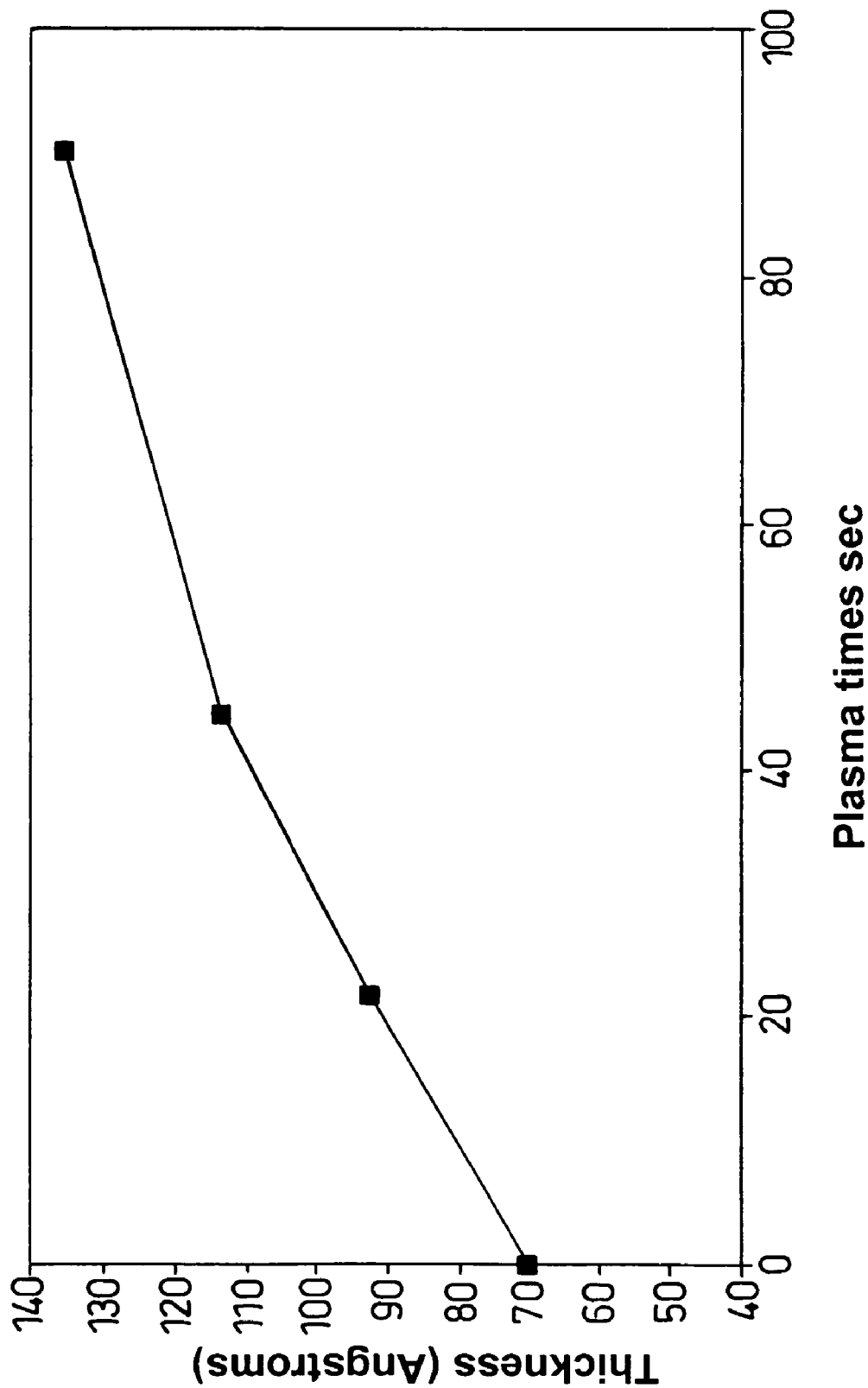
FIG. 1 is a graph illustrating the increase in film thickness which can occur over time during a plasma step, which occurs after a TDEAT deposition step in conventional usage.
Figure 2:
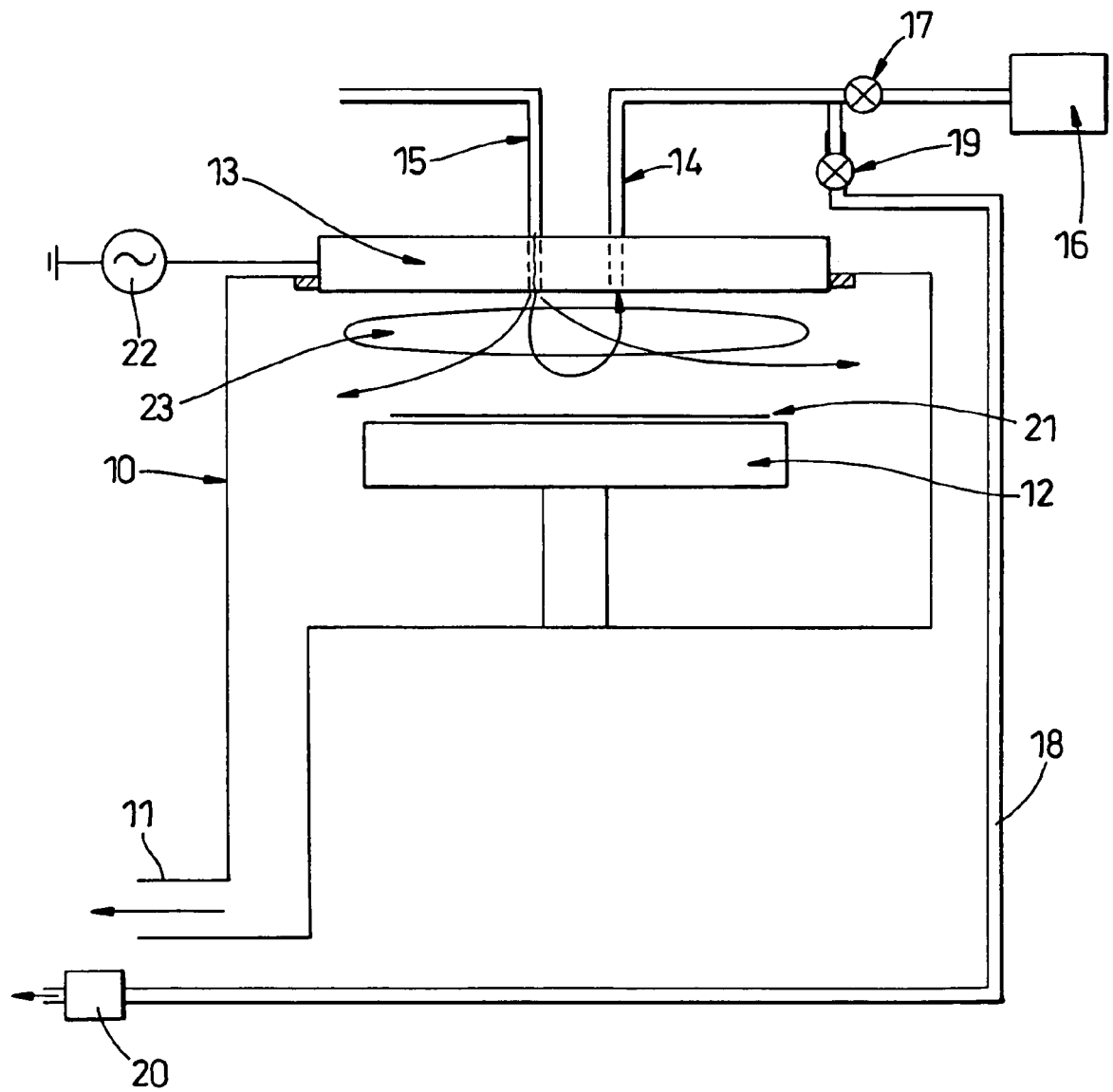
FIG. 2 is a schematic illustration of apparatus for performing the Applicants method.
Figure 3:
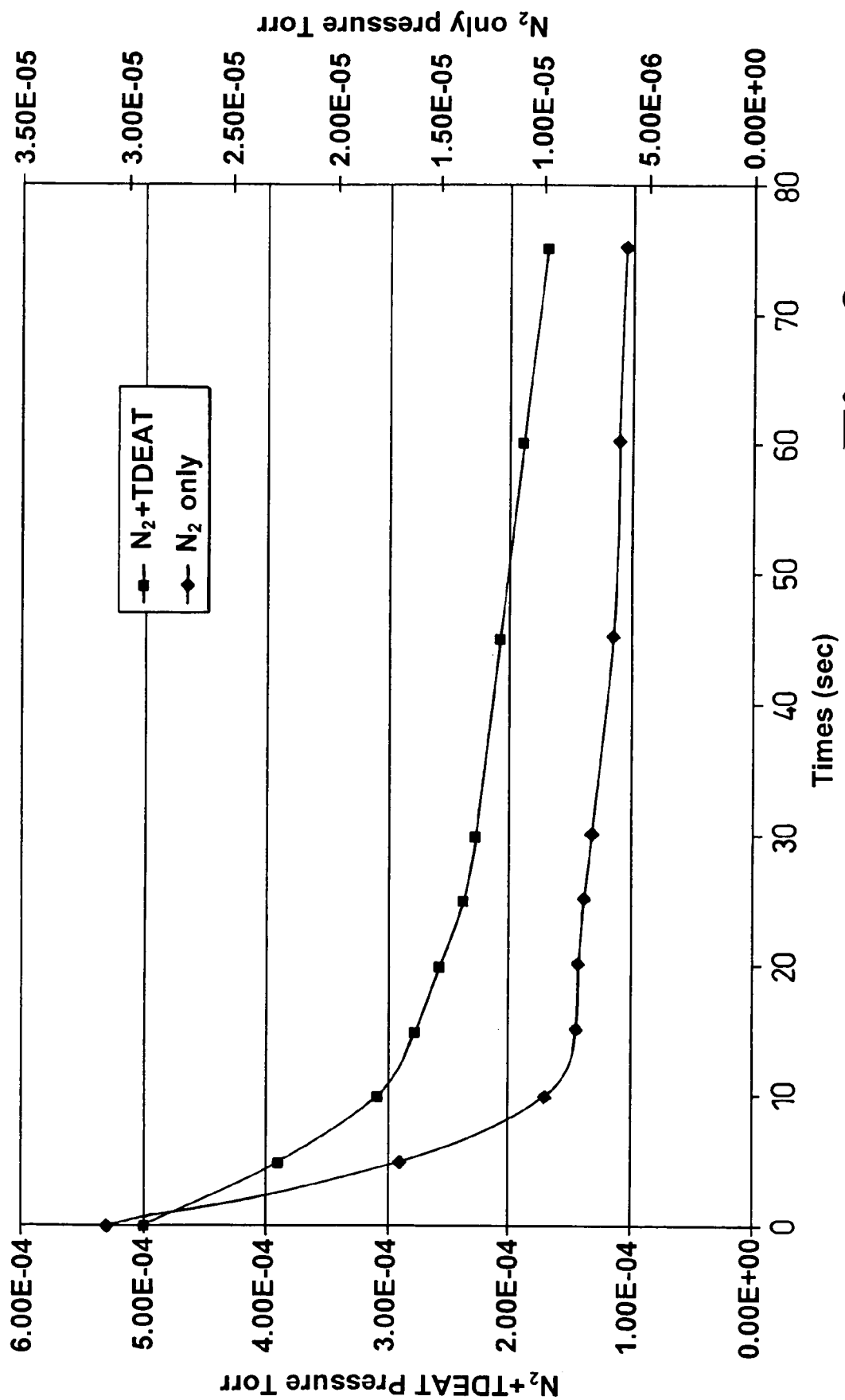
FIG. 3 is a graph illustrating the rate at which pressure in the chamber recovers if the first process is experimentally run first with $N_2$ only supplied and secondly with $N_2$ and TDEAT vapour in a helium carrier gas is supplied.

Conventional means (not shown) are provided for placing and removing workpieces 21 from the support 12. An RF supply 22 is connected to the showerhead 13 for use in striking a plasma 23 when that is required. The support 12 may be floating or grounded or may itself be driven and the power may be supplied to the plasma without using electrodes (e.g. microwave) or by inductive or capacitive means and the showerhead 13 may therefore also be floating, grounded or driven.

In use TDEAT vapour is supplied on gas line 14 and $NH_3$ is supplied on gas line 15 to react within the chamber 10 to deposit a TiN film onto the substrate 21 by chemical vapour deposition as is well known in the art. When the desired film thickness has been deposited the valve 17 is shut off and the supply to gas line 15 is changed to the nitrogen and hydrogen sources. Pump 20 is then turned on and the valve 19 opened. For the reasons set out above the film on the workpiece 21 is then subjected to the nitrogen and hydrogen plasma treatment, but during at least the first part of this process, the pump 12 is sucking a portion of the gas fed through line 15 back up into line 14 to prevent or reduce the diffusion of absorbing TDEAT into the chamber 10 and hence either preventing additional deposition or keeping it within acceptable levels.

It will be appreciated that this arrangement not only overcomes the throughput problems with traditional purging, but also reduces the possibility of detrimental "purge" effects on the deposited film.

In one experiment the following process was run including preheat step, the TDEAT deposition step and a subsequent plasma step. Pumping of the line 18 occurred during the plasma treatment step and unacceptable deposition during the plasma treatment step was avoided.

| Parameter | Pre heat | Deposition | Plasma reaction |
|---|---|---|---|
| gas line 1 | 1000 sccc N2 | 500 sccm NH3 | 500 N2/500 $H_2$ |
| gas line 2 | none | TDEAT varpour in He | none |
| chamber pressure | 2 Torr | 4 Torr | 1.3 Torr |

-continued

| Parameter | Pre heat | Deposition | Plasma reaction |
|---|---|---|---|
| RF power 13.56 MhZ | 0 | 0 | 2500 watts |
| Platen temp | 350 C. | 350 C. | 350 C. |

What is claimed is:

1. A method of processing a workpiece in a chamber including the steps of:
   (a) treating a surface of the workpiece, the step (a) including supplying a reactive gas to the chamber through a first gas supply; and
   (b) further treating the treated surface using a process gas supplied to the chamber through a second gas supply, characterised in that a negative pressure gradient is created and maintained between the chamber and first gas supply during at least a first part of the supply of the process gas of step (b) so that a portion of the process gas flows into the first gas supply from the chamber to mitigate against residual reactive gas entering the chamber during step (b).

2. A method as claimed in claim 1 wherein step (b) is one or more of a thermal, plasma, photonic, chemical or mechanical process.

3. A method as claimed in claim 1 wherein the negative pressure is created and maintained by reverse pumping of that part of the first gas supply which is in or adjacent the chamber during at least the first part of the supply of the process gas.

4. A method as claimed in claim 3 wherein the reverse pumping takes place downstream of a reactive gas shut off valve in the first gas supply.

5. A method as claimed in claim 1 wherein the step (a) is chemical vapour deposition or etching.

6. A method as claimed in claim 5 wherein the step (a) is chemical vapour deposition, wherein the reactive gas is further supplied through the second gas supply and includes a metal organic vapour and $NH_3$, and wherein the vapour is supplied through the first gas supply and the $NH_3$ through the second gas supply.

7. A method as claimed in claim 6 wherein the vapour is Tetrakis (Diethylamido) Titanium.

8. A method of processing a workpiece in a chamber including the steps of:
   (a) treating a surface of the workpiece by chemical vapour deposition or etching, the step (a) including supplying a reactive gas to the chamber through a first gas supply; and
   (b) further treating the treated surface by one or more of a thermal, plasma photonic, chemical or mechanical process including using a process gas supplied to the chamber through a second gas supply characterised in that a negative pressure gradient is created and maintained between the chamber and first gas supply during at least a first part of the supply of the process gas of step (b) so that a portion of the process gas flows into the first gas supply from the chamber to mitigate against residual reactive gas entering the chamber during step (b).

9. A method as claimed in claim 8 wherein the step (a) is chemical vapour deposition, wherein the reactive gas is further supplied through the second gas supply and includes a metal organic vapour and $NH_3$, and wherein the vapour is supplied through the first gas supply and the $NH_3$ through the second gas supply.

10. A method as claimed in claim 8 wherein the vapour is Tetrakis (Diethylamido) Titanium.

11. A method as claimed in claim 8 wherein the negative pressure is created and maintained by reverse pumping of that part of the first gas supply which is in or adjacent the chamber during at least the first part of the supply of the process gas.

12. A method as claimed in claim 11 wherein the reverse pumping takes place downstream of a reactive shut off valve in the first gas supply.

\* \* \* \* \*